United States Patent
Bony et al.

(10) Patent No.: US 9,702,891 B2
(45) Date of Patent: Jul. 11, 2017

(54) ANALOGUE AMPLIFICATION DEVICE INTENDED IN PARTICULAR FOR A LASER ANEMOMETER

(71) Applicants: Epsiline, Toulouse (FR); Institut National Polytechnique de Toulouse, Toulouse (FR)

(72) Inventors: Francis Bony, Lavalette (FR); Raphael Teysseyre, Cugnaux (FR)

(73) Assignees: EPSILINE, Toulouse (FR); INSTITUT NATIONAL POLYTECHNIQUE DE TOULOUSE, Toulouse (FR)

( * ) Notice: Subject to any disclaimer, the term of this patent is extended or adjusted under 35 U.S.C. 154(b) by 216 days.

(21) Appl. No.: 14/423,402

(22) PCT Filed: Aug. 14, 2013

(86) PCT No.: PCT/FR2013/051944
§ 371 (c)(1),
(2) Date: Apr. 30, 2015

(87) PCT Pub. No.: WO2014/029942
PCT Pub. Date: Feb. 27, 2014

(65) Prior Publication Data
US 2015/0233961 A1 Aug. 20, 2015

(30) Foreign Application Priority Data
Aug. 23, 2012 (FR) ...................... 12 57945

(51) Int. Cl.
*G01P 5/26* (2006.01)
*H03F 1/56* (2006.01)
*H03F 3/45* (2006.01)

(52) U.S. Cl.
CPC .................. *G01P 5/26* (2013.01); *H03F 1/56* (2013.01); *H03F 3/45071* (2013.01);
(Continued)

(58) Field of Classification Search
CPC . H03F 1/342; H03F 3/195; H03F 3/50; H03F 2200/135; H03F 2200/294;
(Continued)

(56) References Cited

U.S. PATENT DOCUMENTS 5,438,305 A 8/1995 Hikita et al.
2004/0263376 A1* 12/2004 Shimizu ............... G11C 27/024
341/172
(Continued)

FOREIGN PATENT DOCUMENTS

DE 2643892 A1 3/1978
WO 2012/070777 A2 5/2012

*Primary Examiner* — Luke Ratcliffe
(74) *Attorney, Agent, or Firm* — Seed IP Law Group LLP

(57) ABSTRACT

An analogue amplification device comprises a first stage with a common base or gate transistor that receives the modulated input current on its emitter or its source and the output signal of this first stage corresponds to the signal of the collector, a second stage formed by a follower amplifier comprising a transistor with a common collector or drain setup, a third stage that comprises a transistor with a common emitter setup, and a fourth stage that is an amplifying stage with means allowing the realization of, on the one hand, an amplification, and on the other hand, a matching of impedance. The device can be applied to a laser anemometer with optical retro-injection.

13 Claims, 4 Drawing Sheets

Figure 1:
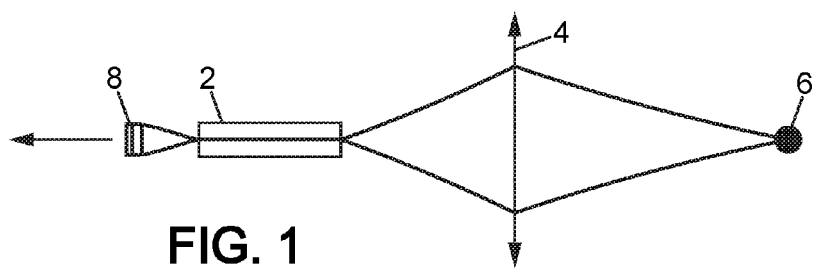

(52) U.S. Cl.
CPC .............. *H03F 2200/54* (2013.01); *H03F 2203/45051* (2013.01); *H03F 2203/45112* (2013.01)

(58) Field of Classification Search
CPC ....... H03F 2200/451; H03F 2203/5036; H03F 2200/18; H03G 1/0023
See application file for complete search history.

(56) References Cited

U.S. PATENT DOCUMENTS

2009/0102552 A1* 4/2009 Shiramizu ............... H03F 1/342
330/98
2012/0242976 A1   9/2012 Lepaysan et al.

* cited by examiner

ANALOGUE AMPLIFICATION DEVICE INTENDED IN PARTICULAR FOR A LASER ANEMOMETER

The present invention relates to an analogue amplification device intended in particular for a laser anemometer such as, for example, a laser anemometer with optical retro-injection.

The present invention is therefore in the field of electronic devices and more particularly of amplification devices. It is conventional to have a sensor for measuring a physical magnitude. This sensor thus supplies an electrical signal that represents the physical magnitude measured. Some sensors supply electrical signals that can be directly used. For other sensors, the supplied signal must be amplified before it can be used.

Consequently, it is a question of amplification devices that present at the same time an elevated gain, a wide bandwidth and low noise. These amplification devices are intended for treating signals presenting a very weak modulation index. This means that the variations of the signal are very weak relative to the average value of the signal. Therefore, the signal is buried in the inherent noise in any case.

Such a problem is found in the field of laser anemometry. In this field, the wind speed is measured with the aid of a laser beam and a sensor that determines the wind speed by analyzing the beams reflected by particles suspended in the air. The measurement is carried out by comparing the frequency of a reflected luminous signal relative to that of the corresponding incident signal. The variation of frequency between the two signals is a function of the speed of the particles and is known by the name of "Doppler effect."

In a laser anemometer, a photodiode is used as measuring sensor. It receives the incident beam and the reflected beam and emits a corresponding signal. The signal corresponding to the reflected beam is very weak in comparison to the signal corresponding to the incident beam. In such an anemometer, the part corresponding to the reflected beam in the supplied signal should be detected.

A laser anemometer is disclosed, for example, in the document WO-2011/042678. The device described in this document comprises means for transmitting a laser beam, called the transmitted beam, means for focusing the transmitted beam at a predetermined focusing distance, means for receiving the transmitted beam after being reflected by a particle present in the air, called the reflected beam, and means for the transmission of the signal of interferences intervening between the transmitted beam and the reflected beam by means of processing the signal in order to deduce the speed of the particle. The transmission means comprise a laser diode and the receiving means is associated with the laser diode by self-mixing. Such an anemometer is also called a laser anemometer with optical retro-injection.

Document DE-26 43 892 discloses an amplifying circuit presenting, on the one hand, a transistorized stage with a common base setup as output stage and, on the other hand, a transistorized attack stage with a common collector setup, wherein the attack stage and the output stage are connected by a matching circuit comprising an input impedance greater than its output impedance. The circuits proposed in this document have a significant input impedance. If such an impedance is coupled to a junction capacitance of a photodiode, the bandwidth of the system will be greatly limited.

Moreover, realizing a transimpedance amplifier with an operational amplifier in which the output supplying a voltage $V_{out}$ is connected to the inverse input receiving an input current $i_{in}$ by a resistance $R_f$ is known. The gain of such a setup then corresponds to the resistance $R_f$. Given the state of the current art of operational amplifiers, such a setup cannot be effectively used for a signal in which the variations of the signal are very weak in comparison to the average value of the signal as mentioned above.

One goal of the present invention is therefore to obtain a lower noise level (for example, lower than with a transimpedance amplifier comprising an operational amplifier) while retaining satisfactory gain, bandwidth, and impedances of input/output, and advantageously a stable behavior without the risk of oscillations.

Therefore, the invention has the goal of supplying an amplification device having excellent performance and that can be used in particular for an optoelectronic detection module of a laser anemometer with optical retro-injection. However, an amplification device in accordance with the present invention can also be used in other applications in which a weak signal is superposed on a larger signal.

The device in accordance with the present invention preferably has a large bandwidth. The noise of the amplification device, defined by its spectral density of noise power, should be limited. As for the gain supplied by the amplification device, it should be significant.

The amplification device is preferably provided with a supply that does not disturb the good performance of the amplification device with which it is associated.

In the application of the amplification device to a detection module associated with a laser anemometer, the fact that it has a wide bandwidth makes it possible to measure wind speeds over a large range of speeds. In this application, the amplification device receives a modulated current stemming from a photodiode constituting the sensor of the laser anemometer. The noise of the amplification device returned to the input should then be greater than the noise of the photodiode. The gain of the amplification device should be such that the output noise of the latter is significantly greater than the noise of the analogue/digital converter used in the detection module associated with the anemometer.

In the field of laser anemometry with optical reinjection, elevated performances should be realized by the amplification electronics. By way of illustration, at the beginning of the present invention, specifications simultaneously required having a transimpedance gain $V_{out}/i_{in}$ (that is, the relationship between the output voltage of the circuit and intensity of the input) greater than 50 k$\Omega$, a low input impedance in front of the impedance of the source (that is to say, lower than 100$\Omega$), an equivalent noise returned to the lower input of $9 \cdot 10^{-23}$ A$^2$/Hz, a bandwidth greater than 100 MHz and to have an output impedance of 50$\Omega$.

In order to obtain an amplifier circuit that allows such performances to be achieved, the present invention proposes an analogue amplification device comprising four stages in a cascade, an input for receiving a modulated current, and an output under voltage, which device comprises a ground and a supply voltage.

According to the present invention, in such a device:
the first stage comprises a transistor with a common base or gate setup that receives the modulated input current via a capacitor on its emitter or its source, and the output signal of this first stage corresponds to the signal of the collector or drain,
the second stage is formed by a follower amplifier comprising a transistor with a common collector or drain setup whose base or gate receives the output signal of the first stage, whose collector or drain is connected to the supply voltage and whose emitter or source is connected to the ground by a resistor and supplies the output signal of the second stage, the third stage comprises a transistor with a common emitter or common source setup with decoupling of the resistance of the emitter or of the source, wherein the base or gate receives the output signal of the second stage via a capacitor and the output signal corresponds to the signal of the collector or of the drain, and the fourth stage is an amplifying stage with means allowing the realization of, on the one hand, an amplification, and on the other hand, a matching of impedance.

This structure with several stages allows a significant gain and the use of transmitters such as mentioned permits the obtention of performances that cannot be obtained by using amplification devices with an operational amplifier. In the field of laser anemometry, the novel structure proposed here allows a noticeable increase of the performances for the measurements of wind speeds that are carried out.

The present invention can be carried out with "conventional" transistors that can comprise a base, an emitter and a collector or also with field effect transistors comprising for their part a gate, a source and a drain.

In a preferred embodiment of an analogue amplification device according to the invention, in the first stage, the emitter (or the source) is also connected to the ground by a resistor in that the base is connected to the ground by a capacitor and in that the potential of the base is maintained at a potential close to the ground, and that the collector is connected by a resistor to the supply voltage.

An advantageous form of the invention provides that in the third stage, the base or the gate is biased at a voltage close to the voltage of the ground in that the emitter or the source is connected by an RC circuit to the ground and that the collector or the drain is connected to the supply voltage by a resistor.

In one embodiment, the fourth stage can comprise an operational amplifier that receives the output signal of the third stage on its non-inverted input via a capacitor, wherein the output of the amplifier corresponds to the output of the amplification device. In this embodiment, it can also be provided that the inverted input of the operational amplifier is connected to the ground by a resistor and by a capacitor in series, that the output is connected to the inverted input by a resistor, and that the non-inverted input of the operational amplifier is biased at a voltage corresponding approximately to one half of the supply voltage.

A variant can provide that the fourth stage comprises, on the one hand, an amplification circuit with a transistor, and on the other hand, a follower circuit, possibly also with a transistor. The amplification circuit can comprise, for example, a common emitter (or source) setup and the follower setup can be the type of setup proposed for the second stage. The operational amplifier used here is preferably an amplifier with counter-reaction current that has better dynamic performances than an operational amplifier with counter-reaction voltage.

It is also possible to envision for the fourth stage a combination of a setup with a transistor with an operational amplifier setup.

The different architectures proposed here for the fourth stage permit the simultaneous realization of an amplification and a matching of impedance.

In an analogue amplification device according to the invention, the transistor used in the first stage is advantageously a transistor of the NPN type because such a transistor has a transition frequency greater than that of a PNP transistor.

The transistor of the second stage preferably has the same characteristics as the transistor of the first stage. Therefore, its added charge capacity is close to its base collector capacity, which causes a drop of the cutoff frequency by a factor of 2.

It is also advantageously provided, for example, that the transistor of the third stage has the same characteristics as the transistor of the first stage.

The present invention also relates to a unit formed by an analogue amplification device and to a supply system of this analogue amplification device, characterized in that the analogue amplification device is a device such as that described above, and in that the supply system comprises, on the one hand, an input filter and, on the other hand, a filtering module that simultaneously allows an insulation and a low frequency decoupling and an insulation and a high frequency decoupling between the input filter and each stage of the amplification device. With such a structure, each stage of the amplification device of an adjacent stage can be well-insulated and this supply is also well insulated by virtue of the input filter in particular from external disturbances.

Each filtering module comprises, for example, a supply track on which are advantageously located, on the one hand, a linear regulator and, on the other hand, a ferrite. This structure allows a good insulation and a good decoupling to be ensured.

Finally, the present invention also relates to a Doppler-effect laser anemometer with optical retro-injection comprising a laser diode for transmitting a laser beam, a lens for focusing, on the one hand, a beam transmitted by the laser diode and, on the other hand, a beam reflected by a particle located in a volume called the measuring volume, which reflected beam corresponds to a beam transmitted by the laser diode, a photodiode for receiving this reflected beam after it has traversed the laser diode, means for the amplification of a signal supplied by the photodiode as well as means for processing the amplified signal.

Such an anemometer according to the invention is characterized in that the amplification means comprises an analogue amplification device such as that described above.

Figure 2:
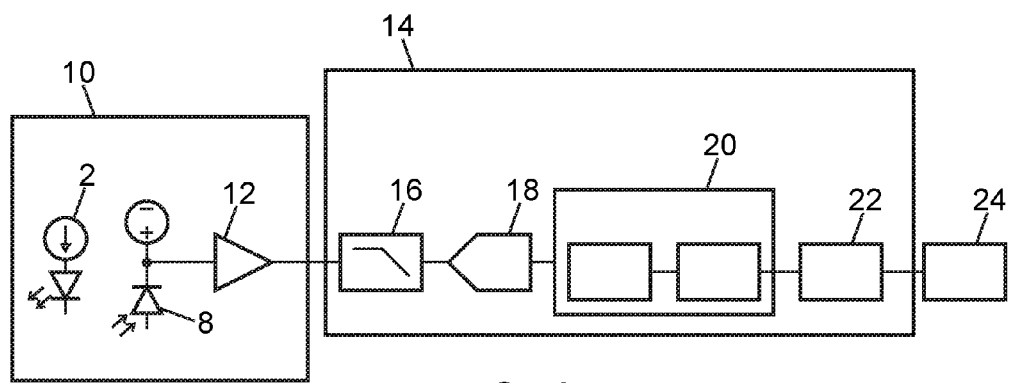
Figure 3:
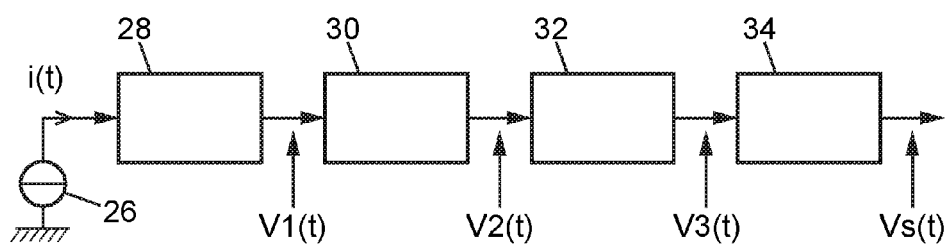
Figure 4:
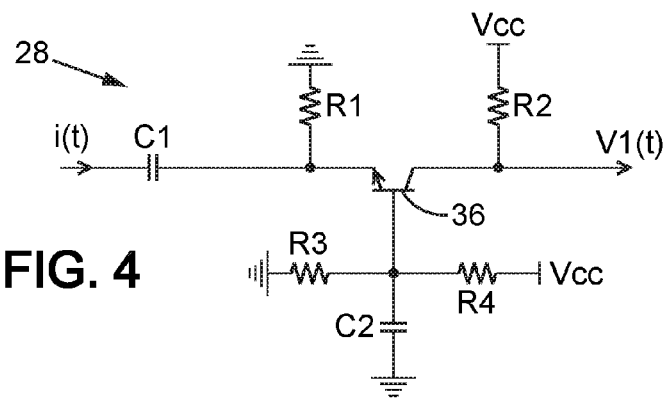
Figure 5:
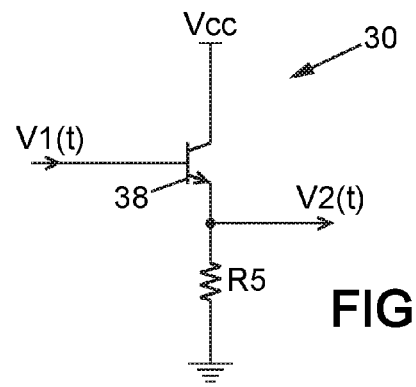
Figure 6:
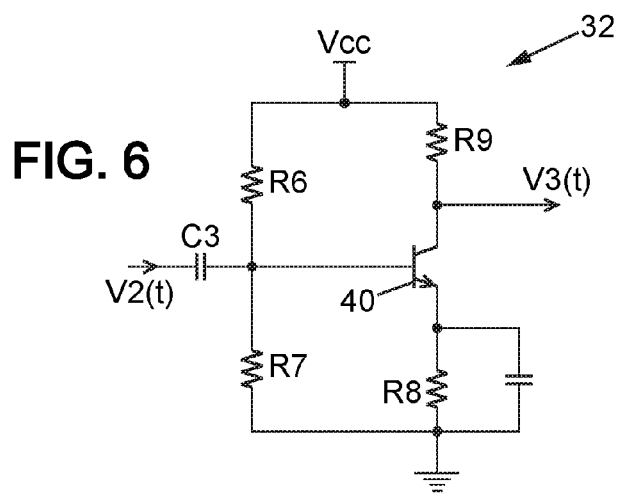
Figure 7:
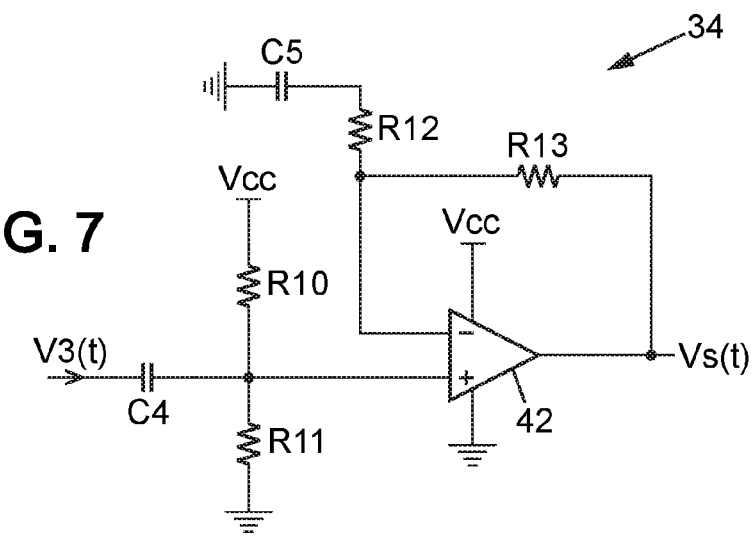
Figure 8:
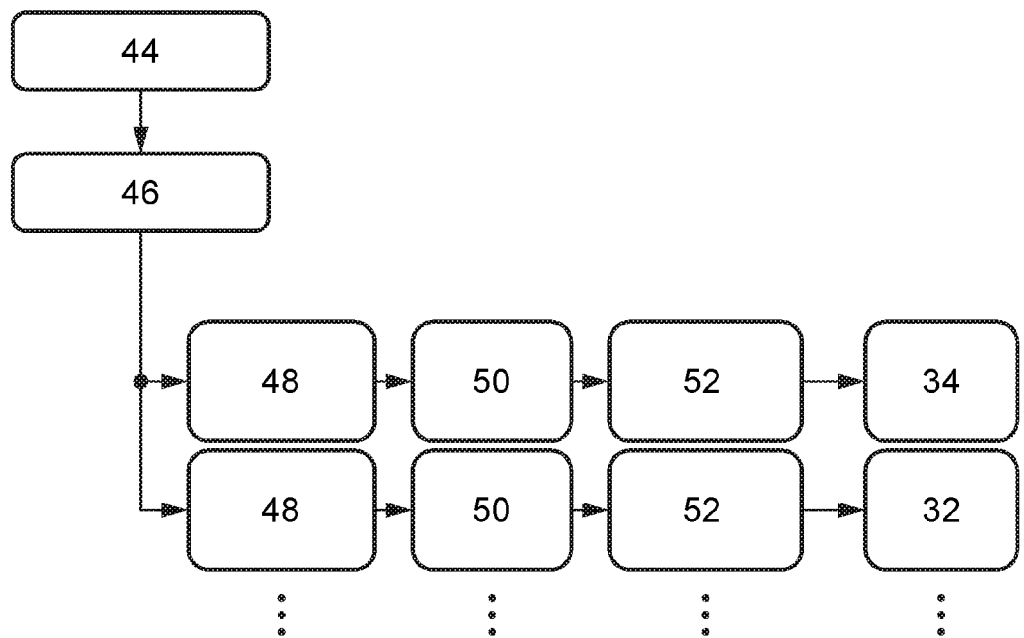
Figure 9:
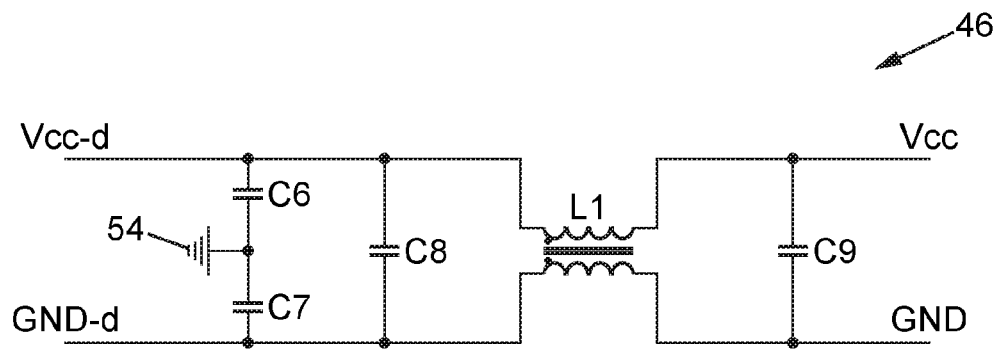
Figure 10:
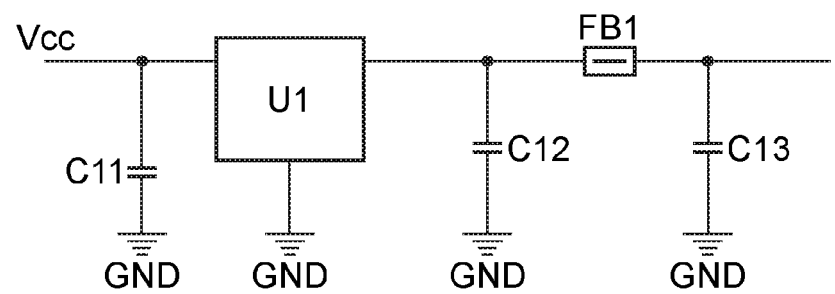

Details and advantages of the present invention will clear from the following description given with reference made to the attached schematic drawings in which:

FIG. 1 schematically illustrates the principle of a laser anemometer with optical retro-injection, FIG. 2 schematically shows a string for the acquisition of such a laser anemometer, FIG. 3 is a diagram schematically illustrating an amplification device according to the present invention, FIG. 4 is an example of an embodiment of a first stage of an amplification device according to the present invention, FIG. 5 is a schematic drawing of an example of a second stage of an amplification device according to the present invention, FIG. 6 is a schematic drawing of an example of a third stage of an amplification device according to the present invention, FIG. 7 is a schematic drawing of an example of a fourth stage of an amplification device according to the present invention, FIG. 8 illustrates a supply device that can be associated with an amplification device according to the present invention, FIG. 9 schematically shows an input filter of the supply device of FIG. 8, and FIG. 10 shows a filter of the supply device of FIG. 8 for being associated with a state of the amplification device according to the present invention.

FIG. 1 illustrates a Doppler-effect laser anemometer with optical retro-injection. Such an anemometer uses a retrodiffused signal by a particle carried by the wind for calculating the value of the wind speed.

A laser diode 2 for transmitting a laser beam can be recognized in FIG. 1. This laser diode 2 comprises an optical cavity in which the beam is generated. The beam transmitted by the laser diode 2 is focused by an optical system 4 toward a measuring region 6. A particle located in the measuring region 6 will reflect the incident beam that will be redirected by the optical system 4 toward the laser diode 2. Therefore, the reflected beam traverses the laser diode 2 and interacts with the laser wave inside the optical cavity of the laser diode 2. Whereas the laser diode 2 transmits to the front (that is, toward the optical system 4) but also to the rear (that is, toward the photodiode 8), the photodiode 8 receives a laser beam corresponding to the interacting mixture of the laser wave and of the wave that is reflected or retro-diffused by a particle located in the measuring region 6. It will be readily understood that the power of the beam that is reflected or retro-diffused by a particle located in the measuring region 6 is quite less than the power of the beam transmitted by the laser diode 2.

If the power of a laser beam exiting directly from the laser diode 2 is called $P_0$ and $P_2$ is the power arriving on the photodiode 8, corresponding to the incident beam stemming directly from the laser diode 2 modulated at the Doppler frequency by the beam reflected by a particle located in the measuring region 6, the modulation depth and power is written:

$$P_0(t) = P_0(1 + m \cos(2\pi \Delta f t))$$

The Doppler frequency is expressed by the formula:

$$\Delta f = \frac{2}{\lambda} |\vec{V} \cdot \vec{u}|$$

$\vec{v}$ is the speed vector of the particle considered as the speed vector of the wind.

$\vec{u}$ is the unit vector corresponding to the optical axis or also the propagation axis of the laser beam.

$\vec{V} \times \vec{u}$ is the scalar product giving the projection of the speed vector on the axis of the laser beam.

$\lambda$ is the wavelength of the laser.

m is the index of modulation and frequency created by the interaction.

The modulation index m of the signal is a function of parameters connected, on the one hand, to the detection configuration and, on the other hand, to the laser diode.

In the case of a laser diode known to a person skilled in the art by the name of a Fabry-Perot laser diode, for a beam with a wavelength of 785 nm and an optical power of 100 mW, furthermore with a focal lens of 20 mm and a diameter of 20 mm for a focusing distance of 1 m, there is, therefore, for example, a modulation index m of $1.5[\cdot]10^{-4}$.

The photodiode 8 then has the function of transforming the modulated optical power ($P_2$) into a modulated current.

The current is then amplified in order to obtain a voltage. As the modulation index is weak, the signal is buried in the noise even after amplification. On the other hand, in the frequency area, the ratio of signal to noise can be sufficient and the signal spectrum can contain a peak above the noise level that corresponds to the Doppler frequency if the signal-to-noise ratio is sufficient. Therefore, it is possible to find the Doppler frequency corresponding to the peak by applying a Discrete Fourier transform (DFT) and therefore deduce the wind speed from it.

FIG. 2 illustrates an acquisition string for a laser anemometer, but similar devices are found on other electronic devices, especially measuring devices.

There is an analogue card 10 on the left in FIG. 2 on which the laser diode 2 and the photodiode 8 are found. This analogue card 10 also supports an amplification device called amplifier 12 in the following, which will be described in more detail below.

The amplifier 12 has the purpose of supplying an electrical signal that can be used by a digital card 14 for processing the amplified signal. FIG. 2 shows an example of a digital card that is illustrated very schematically here. A low-pass filter 16 is located, for example, at the input of this card. An analogue/digital converter, also known as ADC 18 is located downstream from this filter and is followed by a programmable gate array also known by the English acronym FPGA 20 (for Field Programmable Gate Array). Several modules are located within this FPGA 20 for carrying out various calculations such as, for example, carrying out a Fourier transformation, using the results of this transformation, etc. Once the calculations have been carried out, a communication module 22 puts the results in a normalized format in such a manner that they can be used by a data recorder or a computer 24, for example, a personal computer.

FIG. 3 shows a schematic illustration of the amplifier 12. This figure also shows a current generator 26 that supplies a current i(t) to the amplifier 12. The latter comprises a first stage 28, a second stage 30, a third stage 32 and a fourth stage 34. There is a voltage V1(t) at the output of the first stage 28, a voltage V2(t) at the output of the second stage, a voltage V3(t) at the output of the third stage, and a voltage Vs(t) at the output of amplifier 12.

This amplifier 12 first carries out a current-voltage conversion in the first stage 28. As for the second stage 30, it carries out a matching of impedance that is necessary in order to prevent the gain obtained in the first stage 28 from dropping. This second stage 30 serves as an interface between the first stage 28 and the third stage 32, that is, a stage of supplementary amplification. The fourth stage 34 proposed here has the purpose of again increasing the gain of the global string and allowing a matching of impedance before the sampling of the signal in the digital card 14.

An example of the first stage is shown in FIG. 4. This first stage 28 receives the current i(t) at the input. This first stage 28 is realized around a transistor 36 in a common base type setup. Such a setup supplies a good bandwidth and a significant gain at the same time. Furthermore, it supplies a significant stability compared, for example, to using an operational amplifier (used in the prior art). The transistor 36 used here is a conventional transistor comprising a base, an emitter, and a collector. It could, however, also be a transistor with field effect (like the other transistors of the amplification device described here).

The current i(t) is sent to the emitter of the transistor 36 passing through a first capacitor C1. The emitter of the transistor 36 is also connected to the ground by a first resistor R1. This resistor serves to fix the current in the emitter of the transistor 36. This current is fixed, for example, at 0.25 mA, in order to limit the deterioration of the signal-to-jamming ratio for noise. The collector of the transistor 36 is connected to a supply voltage Vcc via a second resistor R2. This resistor serves to fix the gain of the first stage 28.

The base of the transistor 36 is maintained at a constant potential by resistors R3 and R4. The resistor R3 is connected between the base of the transistor 36 and the ground, whereas the resistor 34 is connected between the base of the transistor 36 and the supply voltage Vcc. A capacitor C2 is also provided at the level of the base of the transistor 36, which capacitor plays the part of a decoupling capacitor. This capacitor C2 is connected between the base of the transistor 36 and the ground. Such a setup allows the transition capacitance of the base/collector junction to be minimized. In a dynamic regime, this connection is viewed as a ground. The input impedance of the setup is the dynamic resistance of the base emitter function.

The output impedance of this setup is R2. The continuous current is suppressed by the decoupling capacitor C2. Therefore, the bias of the setup is not a function of the bias of the photodiode 8.

The transistor 36 is preferably an NPN transistor because its transition frequency is greater than that of a PNP transistor.

FIG. 5 illustrates an embodiment of the second stage 30. The second stage carries out a matching of impedance in order to prevent the gain of the first stage 28 from falling while connection it to the third stage 32. This second stage 30 comprises a transistor 38 that is preferably identical to the transistor 36 of the first stage. However, the setup is different since it is a common collector setup. In this stage, the current is fixed by the voltage of the first stage 28 and by the value of a resistor R5 mounted between the emitter of the transistor 38 and the ground, because this stage does not have connecting capacity. However, the follower setup represented in FIG. 5 adds a charge capacity to the first stage 28 that lowers the cut-off frequency of the first one. In order to eliminate this phenomenon, it was chosen to diminish the gain of the first stage 28 in order to increase its bandwidth. Since the transistor 38 has the same characteristics as the transistor 36, the added charge capacity of this transistor 38 is close to the base collector capacity. Therefore, this brings about a drop of the cut-off frequency by a factor of 2. In order to compensate for this loss, the gain is also reduced by the same proportion. Therefore, 6 dB is lost in the stage gain.

The third stage 32 is shown in FIG. 6. This stage is a stage of supplementary amplification for augmenting the global gain of the amplifier 12. It is proposed here to have a third stage 32 comprising a transistor 40 in a common emitter setup with decoupling of the resistance of the emitter. Since the input voltage of this second stage 32 is only several mV, it is not necessary here to integrate a counter-reaction in the setup in order to limit the distortion in amplitude. The transistor 40 itself preferably has the same dynamic characteristics as the transistor 36 of the first stage. Therefore, the transistor 40 can ensure a significant gain and a broad bandwidth by its transition frequency and its low junction capacitance.

In order to minimize the transition capacitance of the base collector junction in the transistor 40, a bias array with resistances R6 and R7 fixes a voltage of the base as close as possible to the ground in order to minimize the transition capacitance of the base collector junction. The resistor R6 is mounted between the base of the transistor 40 and the supply source Vcc, whereas the resistor R7 is mounted between the base of the transistor 40 and the ground. In order to have a voltage close to the ground, the resistor R7 is very weak relative to the resistor R6. At the input of the third stage 32, a capacitor C3 allows the bias points of the two stages to be dissociated, and therefore to realize the controls of the parameters of the third stage 32 without taking into account the parameters of the second stage 30.

A resistor R8 mounted between the emitter and the ground allows the current to be fixed that will circulate in the transistor 40. The value of this current is fixed, for example, at 1 mA. The resistor R8 is decoupled.

In FIG. 6, a resistor R9 mounted between the collector of the transistor 40 and the supply voltage Vcc allows the gain of the amplifier stage to be fixed. This resistor R9 also supplies the output impedance of this third stage 32.

FIG. 7 shows a proposed setup for realizing the fourth stage 34. This is realized around an operational amplifier 42. The signal coming from the third stage 32 arrives at the non-inverted input of the operational amplifier 42 after having passed through a capacitor C4 for eliminating the continuous component of this signal. The non-inverted input of the operational amplifier 42 can therefore be biased by an array of resistors R10 and R11. The resistor R10 is mounted between the non-inverted input of the operational amplifier 42 and the supply voltage Vcc, whereas the resistor R11 is connected between the non-inverted input of the operational amplifier 42 and the ground. By selecting two identical resistors R10 and R11, a bias of this non-inverted input is realized at a voltage of Vcc/2.

The output of the operational amplifier is connected to its inverted input by a resistor R13. The inverted input of the operational amplifier 42 is also connected to the ground by a resistor R12 and a capacitor C5. The addition of this capacitor avoids the amplification of continuous voltages and therefore allows the offset voltage of the operational amplifier not to be taken into account. The resistors R12 and R13 allow the gain of the fourth stage 34 to be fixed.

An operational amplifier 42 with counter-reaction current is preferably used here in order to have available better dynamic performances relative to a conventional operational amplifier with counter-reaction voltage. Such an operational amplifier 42 also has the advantage of not having a high-impedance inverted input, which allows the avoidance of the couplings by electrical fields on this input.

The fourth stage ensures a function of amplification and a function of matching of impedance. In the structure described, it is possible to envisage here replacing the described setup with another setup ensuring these two functions. Therefore, for example, it is possible to propose the combination of an amplification setup of the common emitter type (or common source with a field effect transistor) with a follower setup with transistor or an operational amplifier. This later solution allows to obtain a quasi-perfect follower setup.

Then, the amplifier 12 is obtained by mounting the different stages described above in cascade. For example, it is possible to obtain a gain of 53 dB at the level of the first stage 28. As for the third stage 32, it can have a gain of 28 dB. Finally, the fourth stage can have a gain of 23 dB. A gain of 104 dB is globally obtained for the amplifier 12 with these digital values, given purely by way of illustration and in a non-limiting manner.

The bandwidth of this amplifier is, for example, 125 MHz, while its spectral density of noise power is, for example, $8 \cdot 10^{-23}$ A$^2$/Hz.

In the case of an application for laser anemometry, such performances allow the wind speed to be measured up to 49 m/s when the wind arrives straight on for the wavelength of an incident beam of 785 nm. This then allows an increase of the wind speed that can be measured.

In order to obtain such performances, it is appropriate to limit all the disturbances in order to act on this amplifier 12. It is particularly appropriate to take care of the electrical supply of this amplifier. This supply supplies in particular the voltage Vcc that is found in each stage of the amplifier 12.

The present description proposes supplying the amplifier 12 by a supplying device that supplies a constant voltage. In fact, taking into account the gain and the bandwidth of the amplifier 12, the product of the gain by the bandwidth is elevated and brings about a great risk of oscillation. The risk is then having a disturbance of the supply that is coupled back into the input stage. Taking into account the performances of this amplifier 12, if an external disturbance intervenes on the supply, this disturbance is then amplified at the output of the amplifier and would then disturb the output signal, rendering further analysis impossible.

The circuit supplying the amplifier should preferably be such that its impedance as seen by the active components, between a supply rail of this array and its ground, is the weakest possible. The impedance of the supply rail between two active components should, for its part, be as large as possible in order to minimize the influence of one stage of the amplifier on another stage of the amplifier. Finally, the circuit supplying the amplifier is preferably such that all the external disturbances are filtered at the input onto the analogue card.

Each stage of the amplifier requires the same supply voltage here. A solution of the prior art would therefore be to supply all the amplifier stages by the same track or the same supply plane by adding decoupling capacitors to each stage. This track or this supply plane would then be filtered in advance relative to the outside by a single regulator and possibly a single ferrite. However, such an architecture is not efficient enough for the different stages of the amplifier described above because, on the one hand, the different amplifier stages are not sufficiently insulated from each other and, on the other hand, its gain is too large. The combination of these two factors leads to an undesirable oscillating behavior of the amplifier.

FIG. 8 schematically illustrates an original supply circuit for the amplifier described above. The selection is made here to independently supply each stage of the amplifier with the goal of maximizing the impedance between each stage that is sent fed through a dedicated regulator and a dedicated ferrite. The regulator then has the goal of insulating the stages between themselves at low frequencies (for example <1 MHz), whereas the ferrite allows the insulating of the stages between themselves at high frequencies (for example, >1 MHz).

The circuit shown in FIG. 8 comprises first of all a supply connector 44 that connects the supply circuit to an energy source. As suggested above, the supply circuit comprises at the input an input filter 46 that is represented in more detail in FIG. 9. After the input filter, there is a supply block for each amplifier stage. FIG. 8 shows two supply blocks of the four necessary for the amplifier 12. FIG. 10 illustrates an example of a supply block. Each supply block supplying a stage of the amplifier 12 comprises a first module 48 producing a low-frequency insulation and a low-frequency decoupling, a second module 50 producing a high-frequency insulation, and a third module 52 producing a high-frequency decoupling.

The input filter 46 shown in FIG. 9 is dimensioned for functioning in an optimal manner in the bandwidth of the amplifier 12. It is placed at the input of the setup in order to immunize the entire circuit against the external disturbances conducted at the card input, which disturbances can be, for example, a decoupling of the upstream supply, a coupling of the emissions conducted and radiated by the digital part of the system, a coupling of external waves (for example, radio emissions), etc. This input filter 46 is therefore realized in such a manner as to maximize the losses for a parasitic signal traversing the supplies.

The supply connector 44 supplies potentials Vcc_d and GND_d that are then found at the input of the input filter 46, on the left in FIG. 9. A potential 54, sometimes called SHIELD, symbolizes the mechanical ground (and the shielding) of the system.

Capacitors C6 and C7 in conjunction with a filter L1 permit the filtering of the common mode of the supplies of the amplifier stages relative to the mechanical ground. Furthermore, capacitors C8 and C9 in conjunction with the filter L1 permit, for their part, the filtering of the differential mode.

The input filter 46 realized in this manner should function efficiently in the bandwidth of the amplifier 12. In the digital example given previously, the input filter should function efficiently over a range of frequencies from 100 kHz to at least 150 MHz. The impedance of the capacitors C6, C7, C8 and C9 must therefore be as weak as possible on this frequency band (lower than 1Ω), and the impedance of the filter L1 here must be as strong as possible (greater than 1Ω), which applies in the common mode as well as in the differential mode.

At the output, this input filter 46 then furnishes potentials Vcc and GND that are then "cleaned" of parasites potentially conducted by the supplies Vcc_d and GND_d.

After this input filter 46 has formed a first filter, a supply block is provided for each of the amplifier stages. Such a supply block is illustrated in FIG. 10.

In order to create a filtering between the first filter and the corresponding amplification stage, it is proposed that a linear regulator (U1, with associated decoupling capacitors C11 and C12) be used. This regulator is provided for supporting the current consumed by the corresponding stage (typically less than 50 mA). A regulator known by the regulator name LDO (English acronym for Low DropOut for a low voltage drop) allows a low voltage drop to be preferred in order to lose the least power possible. The regulators generally allow insulation greater than 30 dB up to frequencies on the order of a megahertz (the exact values depend on the regulators selected): the insulation between two stages is then 60 dB to frequencies on the order of a megahertz.

In order to complete the installation and the decoupling up to 150 MHz (for the digital example given above), it is proposed here to add passive components after the regulator. First of all, a ferrite FB1 that has, for example, for the digital values given, an impedance greater than 100Ω from several megahertz up to 150 MHz (and more if possible). In the scheme proposed in FIG. 10, this ferrite FB1 is placed in series on the supply track. After this ferrite, a capacitor C13 is placed in parallel between the supply track and the ground. This capacitor C13 preferably has an impedance lower than 1Ω from several megahertz to 150 MHz (for the digital example above). The ferrite FB1 also prevents the resonance of the capacitor C12 with the capacitor C13.

The supply circuit presented here and illustrated by FIGS. 8-10 allows the following functions to be realized over the entire useful bandwidth of the amplifier 12: insulation against external disturbances, insulation of the different stages among themselves, and a supply impedance viewed by the active components that is sufficiently weak to guarantee their good functioning.

The present invention is not limited to the preferred embodiment described above by way of a non-limiting example, but also concerns all the variants of embodiments within the scope of a person skilled in the art in the framework of the following claims.

The invention claimed is:

1. An analogue amplification device comprising:
   an input for receiving a modulated current;
   an output configured to supply an output voltage;
   a ground terminal;
   a supply voltage terminal;
   a first stage that comprises a first capacitor and a first transistor with an emitter or a source, a collector or a drain, and a common base or gate setup, the emitter or source of the first transistor being arranged to receive the modulated current via the first capacitor, the first stage being configured to supply a first output signal that corresponds to a signal of the collector or drain,
   a second stage formed by a follower amplifier comprising a second transistor with a common collector or drain setup, the second transistor including a collector or drain, a base or gate that receives the first output signal of the first stage, and an emitter or a source, the collector or drain of the second transistor being connected to the supply terminal and the emitter or source of the second transistor being connected to the ground terminal by a resistor and is configured to provide a second output signal of the second stage,
   a third stage that comprises a third transistor with a common emitter or common source setup with decoupling of a resistance of an emitter or a source of the third transistor, wherein the third transistor includes a base or gate that receives the second output signal of the second stage via a second capacitor and the third stage is configured to provide a third output signal corresponds to a signal of a collector or drain of the third transistor, and
   a fourth stage that is an amplifying stage configured to provide an amplification and a matching of impedance.

2. The analogue amplification device according to claim 1, wherein the first stage includes:
   a first resistor connecting the emitter or the source of the first transistor to the ground terminal,
   a third capacitor connecting the base or gate of the first transistor to the ground terminal, whereby a potential of the base or gate of the first transistor is maintained at a potential close to the ground, and
   a second resistor connecting the collector or the drain of the first transistor to the supply voltage terminal.

3. The analogue amplification device according to claim 1, wherein the base or the gate of the third transistor is polarized at a voltage close to a voltage of the ground terminal, wherein the third stage includes:
   an RC circuit connecting the emitter or the source of the third transistor to the ground terminal, and
   a resistor connecting the collector or the drain of the third transistor to the supply voltage terminal.

4. The analogue amplification device according to claim 1, wherein the fourth stage comprises an amplifying circuit selected from the group consisting of:
   an operational amplifier circuit, and
   an amplifier stage with a fourth transistor and a follower stage, the follower stage including a fifth transistor or an operational amplifier.

5. The analogue amplification device according to claim 1, wherein the fourth stage comprises a third capacitor and an operational amplifier having a non-inverted input that receives the third output signal of the third stage via the third capacitor, the operational amplifier having an output that corresponds to the output of the amplification device.

6. The analogue amplification device according to claim 5, wherein:
   an inverted input of the operational amplifier is connected to the ground terminal by a first resistor and by a third capacitor in series,
   the output of the operational amplifier is connected to the inverted input by a second resistor, and
   the non-inverted input of the operational amplifier is biased at a voltage corresponding approximately to one half of a supply voltage of the supply voltage terminal.

7. The analogue amplification device according to claim 5, wherein the operational amplifier of the fourth stage is an amplifier with counter-reaction current.

8. The analogue amplification device according to claim 1, wherein the first transistor is an NPN transistor.

9. The analogue amplification device according to claim 1, wherein the second transistor has the same characteristics as the first transistor.

10. The analogue amplification device according to claim 1, wherein the third transistor has the same characteristics as the first transistor.

11. A unit comprising an analogue amplification device and a supply system configured to supply the analogue amplification device, wherein the analogue amplification device is a device according to claim 1, and the supply system comprises:
    an input filter;
    a first filtering module that simultaneously allows an insulation and a low frequency decoupling and an insulation and a high frequency decoupling between the input filter and the first stage of the amplification device;
    a second filtering module that simultaneously allows an insulation and a low frequency decoupling and an insulation and a high frequency decoupling between the input filter and the second stage of the amplification device;
    a third filtering module that simultaneously allows an insulation and a low frequency decoupling and an insulation and a high frequency decoupling between the input filter and the third stage of the amplification device; and
    a fourth filtering module that simultaneously allows an insulation and a low frequency decoupling and an insulation and a high frequency decoupling between the input filter and the fourth stage of the amplification device;.

12. The unit according to claim 11, wherein each filtering module comprises a supply track on which are located a linear regulator and a ferrite.

13. A Doppler-effect laser anemometer with optical retro-injection comprising:
    a laser diode for transmitting a laser beam,
    a lens for focusing a beam transmitted by the laser diode and a beam reflected by a particle located in a measuring volume, which reflected beam corresponds to a beam transmitted by the laser diode,
    a photodiode for receiving the reflected beam after it has traversed the laser diode,
    means for producing an amplified signal by amplifying a signal supplied by the photodiode, and
    means for processing the amplified signal, wherein the amplification means comprise the analogue amplification device according to claim 1.

* * * * *